A
United States Patent [19]

Younes

[11] Patent Number: 4,965,038

[45] Date of Patent: Oct. 23, 1990

[54] LAMINATED COMPOSITE OF A RIGID POLYURETHANE MODIFIED POLYISOCYANURATE SUBSTRATE AN METAL, PLASTIC, CELLULOSE, GLASS, CERAMIC OR COMBINATIONS THEREOF

[75] Inventor: Usama E. Younes, Newtown Square, Pa.

[73] Assignee: Arco Chemical Technology, Inc., Wilmington, Del.

[21] Appl. No.: 407,593

[22] Filed: Sep. 15, 1989

Related U.S. Application Data

[62] Division of Ser. No. 88,748, Aug. 24, 1987, Pat. No. 4,886,700.

[51] Int. Cl.$^5$ .............................................. B29D 22/00
[52] U.S. Cl. ..................... 264/552; 264/257; 264/319; 264/DIG. 77; 264/DIG. 53; 264/DIG. 19
[58] Field of Search ............................ 264/104, 331.19

[56] References Cited

U.S. PATENT DOCUMENTS

| | | | |
|---|---|---|---|
| 4,623,577 | 11/1986 | Hsue et al. | 428/422.8 |
| 4,705,721 | 11/1987 | Frisch et al. | 428/425.1 |
| 4,709,002 | 11/1987 | Younes | 528/53 |
| 4,731,427 | 3/1988 | Younes | 528/53 |
| 4,757,123 | 7/1988 | Younes | 528/53 |

*Primary Examiner*—Edith Buffalow
*Attorney, Agent, or Firm*—Delbert E. McCaslin

[57] ABSTRACT

Laminated composites including method for the preparation thereof comprising forming in combination in a mold at least one layer of a rigid polyurethane modified polyisocyanurate by reacting in said mold, a reaction mixture of an organic di- or polyisocyanate, a cyclic alkylene carbonate and a polyether polyol in the presence of a soluble adduct aminecarbonate catalyst, and at least one layer of material selected from metal, plastic, cellulose, glass and ceramic or combinations thereof. The electrically conductive "metal clad" laminates are especially useful as printed circuit boards.

10 Claims, No Drawings

LAMINATED COMPOSITE OF A RIGID POLYURETHANE MODIFIED POLYISOCYANURATE SUBSTRATE AN METAL, PLASTIC, CELLULOSE, GLASS, CERAMIC OR COMBINATIONS THEREOF

This application is a divisional of Ser. No. 07/088,748 filed Aug. 24, 1987, now U.S. Pat. No. 4,886,700.

FIELD OF THE INVENTION

This invention relates to laminated composites and method for the preparation thereof, comprising at least one layer of a rigid polyurethane modified polyisocyanurate thermoset composition which is the reaction product of an organic di- or polyisocyanate, a cyclic alkylene carbonate, and a polyether polyol, and at least one layer of material selected from metal, cellulose, plastic, glass and ceramic or combinations thereof. The metalized (metal clad) laminated composites are especially suitable for the production of printed circuit boards by combining the properties of rigidity along with high thermal stability and excellent electrical properties.

BACKGROUND OF THE INVENTION

The preparation of laminated composites employing various polymeric substrate compositions for use as printed circuit boards or for other uses such as corrosion resistant layers, paneling, decorative structures and the like are well known. The polymeric substrates commonly used are the epoxide resin-base materials, triazine resins and polyimide resins for circuit board laminates. Synthetic resin glues such as urea-formaldehyde or phenol-formaldehyde resin in water have been employed in the preparation of wood laminates.

As will hereinafter be set forth in greater detail, it has been discovered that in addition to the preparation of a metal clad laminate for printed circuit boards, which have excellent electrical properties which exceed those required by U.S. Military Specification (MIL-P-13949F), other laminates containing the rigid polyurethane modified polyisocyanurate of the present invention and at least one layer of wood or cellulosic material, plastic, glass, or a ceramic sheet or combinations thereof may be prepared in a compression mold for use in many areas of the construction, building, packaging automotive, electronics, etc. industries.

U.S. Pat. No. 4,623,577 describes a circuit board laminate made from a cross linked polycyanurate polymer and a thermoplastic polymer such as a polyethersulfone and polycarbonate, and a polyaramid fiber.

U.S. Pat. No. 4,562,119 discloses a laminate comprising a central core of cellulosic or mica filler and a thermosetting resin and skin laminae of glass, asbestos or heat stable synthetic polymer reinforcing filler and resin impregnant to which a metal foil is adhered.

Various laminated composites especially for printed circuit boards are also described in U.S. Pat. Nos. 4,671,984, 4,615,945, 4,526,835, 4,520,067, 4,511,757 and 4,492,730.

SUMMARY OF THE INVENTION

According to the present invention, compression molded laminated composites are prepared which comprise at least one layer of a rigid polyurethane modified polyisocyanmurate thermoset composition and at least one layer of material selected from metal, wood or cellulose, plastic, glass and ceramic or combinations of such materials.

It is a primary object of this invention to provide double or single sided metal clad laminates for use in the manufacture of printed circuit boards.

Another object of this invention is the provision of a molded polyurethane modified polyisocyanurate containing laminate with glass filler having exceptional properties.

These and other objects and advantages of this invention will become apparent from the description of the invention and from the claims.

DETAILED DESCRIPTION OF THE INVENTION

In accordance with the present invention, laminate composites are prepared by forming in combination in a compression mold at least one layer of a rigid polyurethane modified polyisocyanurate thermoset composition prepared by reacting in said mold at temperatures of from about ambient to about 140° C. a reaction mixture of an organic di- or polyisocyanurate, from about 2 to about 50, preferably 10 to 25, parts by weight of a cyclic alkylene carbonate and from about 2 to about 50 and preferably from about 10 to about 25 parts by weight of a polyether polyol, based on the isocyanate-carbonate-polyol mixture, and in the presence of a soluble adduct of a tertiary amine and a cyclic alkylene carbonate as catalyst at a concentration of from about 0.005 to about 5.0, preferably 0.008 to 1.0 weight percent based on the total composition, and at least one layer of material selected from the group consisting of metal, cellulose, plastic, glass and ceramic or combinations thereof.

The metal lamina may be electrically conductive copper or copper foil, as well as zinc, nickel, aluminum, steel or other alloys and may be treated on one or both sides as practiced in the printed circuit board industry.

The cellulose lamina of the present invention include wood, sheets or boards, as well as particle board composite articles made of wood chips, fibers, shavings, sawdust, cork, bark, wood, wool and like products. Fibers, particles, etc. from other natural products which are cellulosic and formed into sheets or layers such as straw, nut shells and rice and oat hulls may be used.

The plastic lamina according to the present invention may be a solid, cellular or foamed material or a combination thereof and include, for example, polyvinylchloride, polyvinylidene, polyimides, polyamides, polyesters, epoxies, polycarbonate, polyethylene, polypropylene, polystyrene, polyurethane, polysulfones, nylon and the like. The laminated composite may also contain the plastic in the form of a core surrounded by a layer of rigid polyurethane modified polyisocyanurate thermoset composition.

The ceramic lamina may be, for example, in sheet, strip or tubular form and may be metalized.

Although generally not required since excellent bond and peel strengths are obtained, adhesives or coupling agents, which are temperature compatible may be used on the surface of the metal, cellulose, plastic, glass and ceramic to increase adhesion of the various materials to the polyurethane modified polyisocyanurate substrate to form the laminates. Such adhesives or coupling agents are known in the art and include, for example, silanes, wetting hydrosols, organometallic compounds and polyurethanes.

A wide variety of organic isocyanates including aliphatic alicyclic and aromatic polyisocyanates may be employed in the instant invention and are characterized by containing two or more isocyanate (NCO) groups per molecule.

Typical organic di- or polyisocyanates include p-phenylene diisocyanate, polymethylene polyphenyl isocyanate, toluene-2,4'- and 2,6-diisocyanate or mixtures thereof, diansidine diisocyanate, hexamethylene diisocyanate, naphthalene-1, 4-diisocyanate, naphthalene-1, 4-diisocyanate, octylene-1, 8-diisocyanate, 4,4'-diphenylpropane diisocyanate, 3,3'-dimethyl diphenylmethane-4, 4'-diisocyanate, triphenylmethane triisocyanate, 3,3'-ditolylene-4,4'-diisocyanate, 4-chloro-1, 3-phenylene diisocyanate 1,4-, 1,3-and 1,2-cyclohexylene diisocyanate and in general the isocyanates disclosed in U.S. Pat. No. 3,577,358. Mixtures of polyisocyanates may be used which for example are the crude mixtures of di and higher functional polyisocyanates produced by phosgenation of aniline-formaldehyde condensates or as prepared by the thermal decomposition of the corresponding carbamates dissolved in a suitable solvent as described in U.S. Pat. Nos. 3,962,302 and 3,919,279, both known as crude MDI or PMDI. The organic polyisocyanates may be isocyanate-ended prepolymers made by reacting under standard known conditions, an excess of a polyisocyanate with a polyol which on a polyisocyanate to polyol basis may range from about 20:1 to 2:1 and include for example polyethylene glycol, polypropylene glycol, diethylene glycol monobutyl ether, ethylene glycol, monoethyl ether, triethylene glycol, etc. as well as glycols or poly glycols partially esterified with carboxylic acids including polyester polyols and polyether polyols. Known processes for the preparation of polyamines and corresponding methylene bridged polyphenyl polyisocyanates therefrom are disclosed in the literature and in many patents; for example U.S. Pat. Nos. 2,683,730, 2,950,263, 3,012,008, 3,334,162 and 3,362,979. The isocyanates may contain impurities or additives such as the carbodiimides or uretonimine modified MDI products. The preferred polyisocyanates are the diphenylmethane 2, 4' isomers which may include the 2, 2' isomer and the higher functional polyisocyanate polymethylene polyphenyl isocyanate mixtures, which may contain from about 20 to about 85 weight percent of the diphenylmethane diisocyanate isomers. In general the organic isocyanates will have a molecular weight in the range of between about 100 and about 10,000. Typical of the preferred polyisocyanates are those sold commercially as "Isonate 143-L" and "Isonate 181" by the Dow Chemical Company a carbodiimide modified diphenylmethane diisocyanate and an ethylene glycol capped isocyanate prepolymer having 22.9% NCO respectively, as well as "Rubinate LF168" and "Rubinate LF179" (Rubicon Chemical Inc.) and similar diisocyanates. The amount of isocyanate employed to prepare the polyisocyanurate layer will be from about 95 to about 50 and preferably from about 80 to about 65 parts by weight based on the isocyanate-carbonate-polyol ingredients in the reaction mixture.

The cyclic alkylene carbonates employed in the present invention in amounts of from about 2 to about 50 preferably from about 10 to about 25 parts by weight based on the isocyanate-carbonate-polyol composition have the general formula:

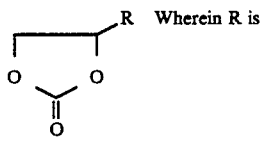

hydrogen, $CH_3$, $C_2H_5$ or $C_3$ to $C_{10}$ hydrocarbons. Typical cyclic alkylene carbonates include, for example, ethylene carbonate, propylene carbonate, butylene carbonate styrene carbonate and octylene carbonate, mixtures thereof and the like. Liquid alkylene carbonates are preferred, however solid or semi-solid carbonates may be used if liquified with other liquid alkylene carbonates or by the reaction temperature at which they are employed. Propylene carbonate is the preferred cyclic alkylene carbonate.

The polyether polyols or mixtures of polyether polyol employed in the present invention in amounts of from about 2 to about 50 preferably from about 10 to about 25 parts by weight are the polyoxyalkylene polyether polyols and include those having 2 to about 10 hydroxyl groups. Such polyether polyols and methods for their preparation are described in "Polyurethanes; Chemistry and Technology" by Saunders and Frisch, Interscience Publishers, 1964. Particularly suitable polyether polyols include those having molecular weights of from about 200 to about 10,000 or higher and preferably molecular weights of from about 2000 to about 8000 and prepared by reacting an initiator compound having 2 to about 8 hydroxyl groups with an alkylene oxide or mixtures of such oxides. Suitable initiator compounds include, for example, ethylene glycol, propylene glycol, water, dipropylene glycol, trimethylene glycol, 1,2-, 1,3- and 1,4-butanediol, glycerol, 1,2,6-hexanetriol, trimethylolethane, trimethylolpropane, pentaerythritol, sorbitol, sucrose and the like. The alkylene oxides suitable for use include ethylene oxide, propylene oxide, 1,2- and 2,3-butylene oxide, styrene oxide, epichlorohydrin, epibromohydrin and mixtures thereof, etc. The polyether polyols may be diols or triols, as well as capped diols or triols or mixtures thereof. Typical of the preferred polyether polyols is "Niax E351" a polyether polyol sold by Union Carbide Corp. and is a capped diol comprising ethylene oxide adducts of polyoxypropylene diol containing primary hydroxyl groups. Amine or hydroxyl terminated polybutadiene may also be employed. Chain extenders of mixtures thereof may also be employed along with the polyether polyols in the total formulation. Such chain extenders include mixtures of difunctional and trifunctional chain extenders. Typical known chain extenders which may be used include diols, amino alcohols and diamines or mixtures thereof.

The catalysts employed in the instant invention in concentrations of from about 0.005 to about 5.0 and preferably about 0.008 to about 1.0 weight percent based on the total composition, for the formation of the laminated composite containing at least one layer of polyurethane modified polyisocyanurate polymer are trimerization catalysts and are soluble complex adducts of the reaction of a tertiary amine and the cyclic alkylene carbonates as set forth hereinabove. The preferred catalyst is an adduct of triethylene diamine (DABCO) and propylene carbonate. In order for the catalysts of the instant invention to provide optimum molding results, i.e., catalyze the reaction mixture during the molding in 2 minutes or less, they should be essentially reacted for periods of from about 1 hour to about 90 days which time period will be dependent on the given catalyst concentration and temperature during reaction. Reaction at ambient temperatures may be employed and would generally be about 12 hours at, for example, a concentration of about 0.5 weight percent. Lesser periods would be realized at higher temperatures, e.g. about 40° C. to about 120° C. and/or at increased concentrations.

Although not essential for the practice of this invention the use of commonly known additives which may enhance color or properties of the polyurethane modified polyisocyanurate polymer may be used if desired. For example, reinforcing materials which may be in powder, granular or long fiber form such as chopped or milled glass fibers, as well as woven, braided, knitted or stitched glass fibers, chopped or milled carbon fibers, silicon fibers, synthetic fibers such as nylon or "Kevlar", polyethylene or polypropylene fibers or strands, natural fibers of wool or cotton, cellulosic particles or fibers may be used.

Woven, knitted, pressed and felted non-woven mats of the fibers may be employed. As indicated hereinabove, exceptional properties are obtained with the process using high density glass mats. The polyurethane modified polyisocyanurate polymer compositions of the present invention are essentially non-cellular rigid composites However, due to the possibility of small amounts of water being present in the reaction components, i.e., polyisocyanate, polyol, and alkylene carbonate as well as the adduct catalyst, the composition may contain small or micro cells in the cured polymer.

Although excellent mold release is obtained with the compression molding formulations to form the laminated compositions of the instant invention alone, external or internal mold release agents such as, for example, the dimethyl siloxanes with organic acid groups may be employed.

The present invention is more fully illustrated by the following examples, which include particular features of the invention. However, the examples are not to be construed as limiting the invention in any way, it being understood that numerous variations are possible without departing from the spirit and scope of the invention.

EXAMPLE 1

This example describes the preparation of a soluble tertiary amine-propylene carbonate adduct catalyst as employed in the present invention.

3995 gm of propylene carbonate ("ARCONATE" 5000 sold by Arco Chemical Company) was dried by passing it through a bed of activated alumina. 40.35 gm of triethylene diamine was added to the propylene carbonate with mixing at 80° C. for 112.5 hours (to react and form the adduct) at which time the mixture turned into a dark brown catalyst solution.

EXAMPLE 2

The following example describes the preparation of a single sided copper clad laminate using a carbodiimide modified diphenylmethane diisocyanate ("Isonate 143-L" sold commercially by Dow Chemical Co.). 50.4 gm of "Isonate 143-L", 23.4 gm of propylene carbonate, 12.6 gm of "Niax E351" polyether polyol and 3.60 gm of the catalyst solution of Example 1 and 0.003 gm of dibutyl tin dilaurate were mixed at room temperature (~25° C.) and the solution poured into a 6×6×0.06 inch stainless steel mold to fill the mold containing one sheet of 1 oz. of an electro deposited zinc coated copper foil sold by Yates Industries and 7 layers of 0.6 oz glass cloth treated with triethyl amine (52% glass, 1.76 gms/cc density). The mold was topped with a sheet of Mylar and placed in a heated hydraulic press at 80° C. and 500 psi pressure and allowed to react and cure for 30 minutes. In order to convert the zinc coating on the copper brass, additional heating was carried out at 150° C. for 90 minutes. The press was then cooled and the molded laminate was removed and cut for testing. "Instron" testing of the laminate gave a tensile strength of 34280 psi, elongation % of 3.0, flex strength of 38095 psi, flex modulus of 2139310 psi and a notched Izod impact of 10.15 ft.lbs/in. Electric properties of the copper clad laminate were tested in accordance with Military Specification MIL-P-13949F for use as printed circuit boards and gave a volume resistivity of $7.4 \times 10^6$ megohms after moisture and $1.2 \times 10^6$ megohms at elevated temperature and a surface resistivity of $3.0 \times 10^4$ after moisture and $2.5 \times 10^5$ megohms at elevated temperature. The dielectric constant was 4.0 and dissipation factor 0.01 at 1 megahertz frequency.

EXAMPLE 3

The following example describes the preparation of a single sided copper clad laminate using a glycol modified diphenylmethane diisocyanate and a fire retardant compound. 70 gm of diphenylmethane diisocyanate ("Rubinate LF179") 10 gm of bis (beta chloroethyl) vinyl phosphonate (as fire retardant), 11.25 gm of propylene carbonate, 15 gm of "Niax E351" and 3.75 gm of the catalyst solution of Example 1 were mixed at room temperature and the solution poured into a 6×6×0.06 inch stainless steel mold to fill the mold containing one sheet of 1 oz. of electrodeposited zinc coated copper foil sold by the Yates Industries and 8 layers of glass cloth as reinforcement. The mold was topped with a Mylar sheet and placed in a heated hydraulic press (80° C. and 500 psi pressure) and allowed to react and cure for 30 minutes. In order to convert the zinc coating on the copper brass, additional heating for 10 hours at 100° C. was carried out. The press was cooled and the laminate removed for testing. Test results showed a tensile strength of 40910 psi, elongation % of 3.8, flex strength of 29875 psi, flex modulus of 1810410 psi and a notched Izod impact of 11.30 ft.lbs/in. Electric properties of the copper clad laminate were tested for use as a printed circuit board in accordance with Military Specification MIL-P-13949F and gave a volume resistivity of $1.3 \times 10^6$ megohms after moisture and $3 \times 10^6$ megohms at elevated temperature and a surface resistivity of $3.6 \times 10^5$ megohms after moisture and $4.1 \times 10^6$ megohms at elevated temperature. The dielectric constant was 4.4 and the dissipation factor 0.01 at 1 megahertz frequency.

EXAMPLE 4

30.0 gm of "Rubinate LF179", a glycol modified high purity diphenylmethane diisocyanate, 18.0 gm of propylene carbonate, 10 gm of "Niax E351" polyether polyol, 1 drop of dibutyl tin dilaurate and 2.0 gm of the catalyst solution of Example 1 were mixed at room temperature and poured into a 6×6×0.06 inch stainless steel mold to fill the mold which contained a ⅛" sheet of foamed polyethylene and one 3 oz. layer of fiber glass reinforcement. The mold was topped with a Mylar sheet and placed in a hydraulic press at 50° C. and allowed to cure for 1 hour under 50 psi pressure. The mold was cooled and the laminate removed for testing. Test results showed a tensile strength of 6281 psi, elongation % of 2.9 and a flex strength of 12331 psi and a flex modulus of 412850 psi.

EXAMPLE 5

The procedure of Example 5 was repeated using the same amounts of isocyanate, propylene carbonate, polyether polyol and catalyst solution mixed at room temperature. The reaction mixture was poured into the 6×6×0.06 inch stainless steel mold to fill the mold which contained a 1/32 inch sheet of nylon film. The mold was topped with a second 1/32 inch sheet of nylon film and mold placed in a preheated 75° C. hydraulic press and allowed to react and cure for 30 minutes under 450 psi pressure. The mold was cooled and the laminate removed for testing. Test results showed a tensile strength of 7950 psi, flex strength of 9025 psi and flex modulus of 325110 psi.

EXAMPLE 6

70 gm of "Rubinate LF 179", 12.5 gm of propylene carbonate 15 gm of "Pluracol 380" (a polyether polyol, sold by BASF Wyandotte Corp., which is a triol from ethylene oxide capped propylene oxide having a hydroxyl No. of 25), 1 drop of dibutyl tin dilaurate and 2.5 gm of the catalyst solution of Example 1 were mixed at room temperature and the solution poured into a 6×6×0.06 inch stainless steel frame mold to fill the mold which contained one sheet of 1 oz of an electrodeposited zinc coated copper foil and 7 layers of 0.6 oz glass cloth. The mold was topped with a sheet of Mylar and placed in a heated hydraulic press at 80° C. and 450 psi pressure and allowed to react and cure for 30 minutes. The press was cooled and the molded laminate removed and cut for testing. Test results showed a tensile strength of 41210 psi, elongation % of 3.8%, flex strength of 31050 psi, flex modulus of 1920525 psi and a notched Izod impact of 10.25 ft-lbs/in. Electrical properties for use as a printed circuit board showed a volume resistivity of $6.9 \times 10^6$ meghoms after moisture and $1.4 \times 10^6$ meghoms at elevated temperature and a surface resistivity of $3.5 \times 10^4$ megohms after moisture and $3.0 \times 10^6$ at elevated temperature. The dielectric constant was 4.0 and the dissipation factor 0.01 at megahertz frequency.

I claim:

1. A method for preparation of a laminated composite which comprises forming in combination in a mold cavity at least one layer of a rigid polyurethane modified polyisocyanurate thermoset composition prepared by reacting in said mold at temperatures of from about ambient to about 140° C. a reaction mixture of an organic di- or polyisocyanate, from about 2 to about 50 parts by weight of a cyclic alkylene carbonate and from about 2 to about 50 parts by weight of a polyether polyol based on the isocyanate-carbonate-polyol mixture, and in the presence of a soluble adduct of a tertiary amine and a cyclic alkylene carbonate as catalyst at a concentration of from about 0.005 to about 5.0 weight percent based on the total composition, and at least one layer of a material selected from the group consisting of metal, plastic, cellulose, glass and ceramic or combinations thereof.

2. A method according to claim 1 wherein the cyclic alkylene carbonate is employed in amounts of from about 10 to about 25 parts by weight.

3. A method according to claim 1 wherein the polyether polyol is employed in amounts of from about 10 to about 25 parts by weight.

4. A method according to claim 1 wherein the catalyst adduct is employed at a concentration of from about 0.008 to about 1.0 weight percent.

5. A method according to claim 1 wherein the organic di- or polyisocyanate is diphenylmethane diisocyanate.

6. A method according to claim 5 wherein the diphenylmethane diisocyanate is carbodiimide modified 7. A method according to claim 5 wherein the diphenylmethane diisocyanate is glycol modified.

8. A method according to claim 1 wherein the alkylene carbonate is propylene carbonate.

9. A method according to claim 1 wherein the soluble adduct is a reaction complex of triethylene diamine and propylene carbonate.

10. A method according to claim 1 wherein the polyurethane modified polyisocyanurate reaction mixture is molded into glass fiber mats as reinforcement.

* * * * *